United States Patent
Madrid

(10) Patent No.: US 7,002,240 B2
(45) Date of Patent: Feb. 21, 2006

(54) SEMICONDUCTOR LEADFRAME FOR STAGGERED BOARD ATTACH

(75) Inventor: Ruben P. Madrid, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 47 days.

(21) Appl. No.: 10/779,117

(22) Filed: Feb. 12, 2004

(65) Prior Publication Data

US 2004/0159917 A1  Aug. 19, 2004

Related U.S. Application Data

(62) Division of application No. 09/990,846, filed on Nov. 21, 2001, now Pat. No. 6,707,135.

(60) Provisional application No. 60/253,505, filed on Nov. 28, 2000.

(51) Int. Cl.
*H01L 23/495* (2006.01)

(52) U.S. Cl. .................. 257/676; 257/667; 257/670

(58) Field of Classification Search ........... 257/666, 257/676, 667, 670

See application file for complete search history.

(56) References Cited

U.S. PATENT DOCUMENTS

| | | | | |
|---|---|---|---|---|
| 5,098,863 A | * | 3/1992 | Dolezal et al. | 29/827 |
| 5,271,148 A | * | 12/1993 | Desrochers et al. | 29/827 |
| 5,557,143 A | | 9/1996 | Seiji | 257/666 |
| 5,753,532 A | * | 5/1998 | Sim | 438/112 |
| 5,877,542 A | * | 3/1999 | Ohuchi | 257/667 |
| 6,258,630 B1 | | 7/2001 | Kawahara | 438/122 |

FOREIGN PATENT DOCUMENTS

| | | |
|---|---|---|
| EP | 0 432 825 A1 | 11/1990 |
| JP | 404170057 A | 11/1990 |

* cited by examiner

*Primary Examiner*—Roy Potter
(74) *Attorney, Agent, or Firm*—Yingsheng Tung; Wade James Brady, III; Frederick J. Telecky, Jr.

(57) ABSTRACT

The semiconductor integrated circuit device comprises a planar leadframe having lead segments arranged in alternating order into first and second pluralities, the segments having their inner tips near the chip mount pad and their outer tips remote from the mount pad. The outer tips have a solderable surface. All outer tips are bent away from the leadframe plane into the direction towards the intended attachment locations on an outside substrate such that the first segment plurality forms an angle of about 70±1° from the plane and the second segment plurality forms an angle of about 75±1° (see FIG. 4). Consequently, the outer tips create a staggered lead pattern suitable for solder attachment to an outside substrate.

8 Claims, 5 Drawing Sheets

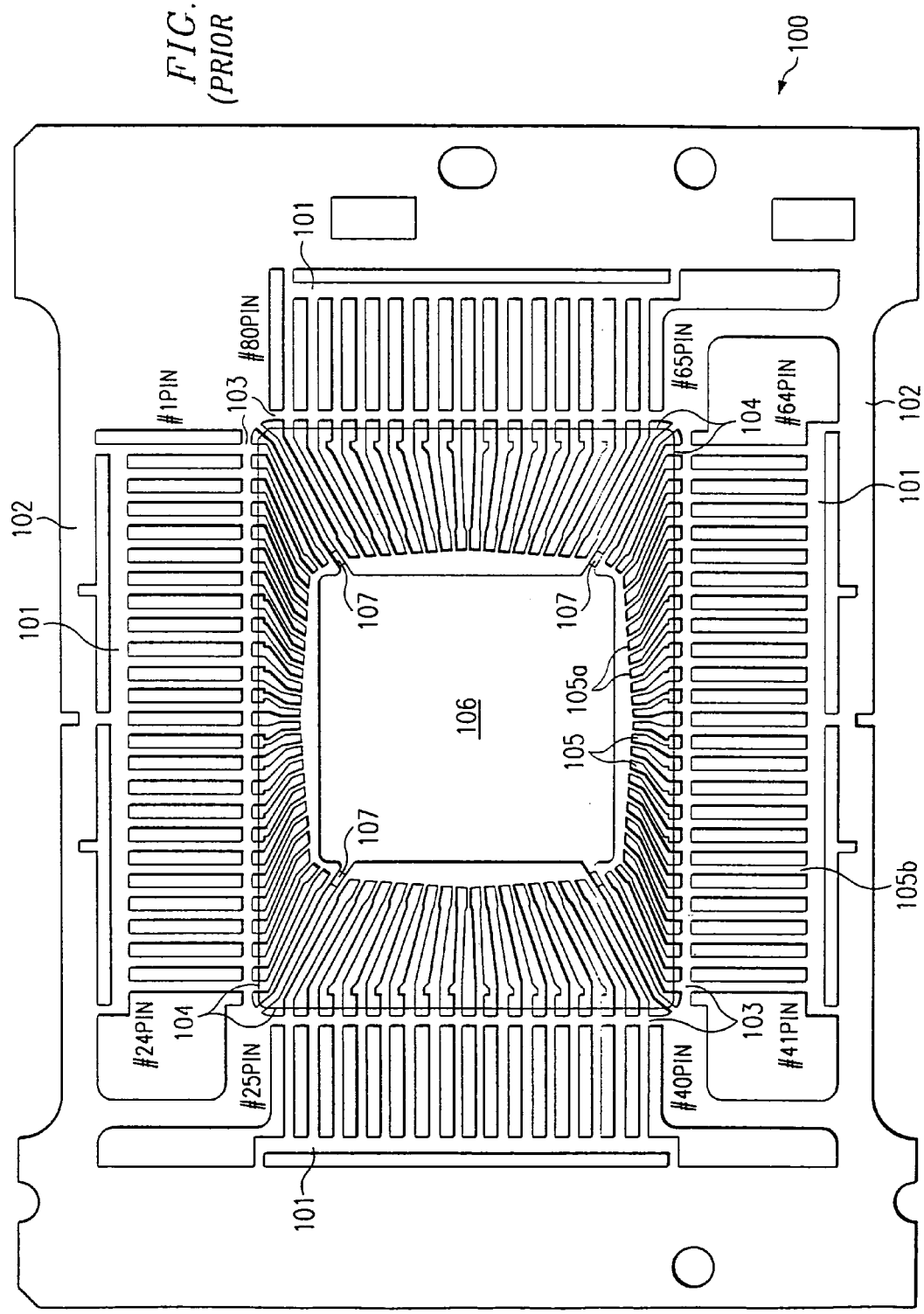

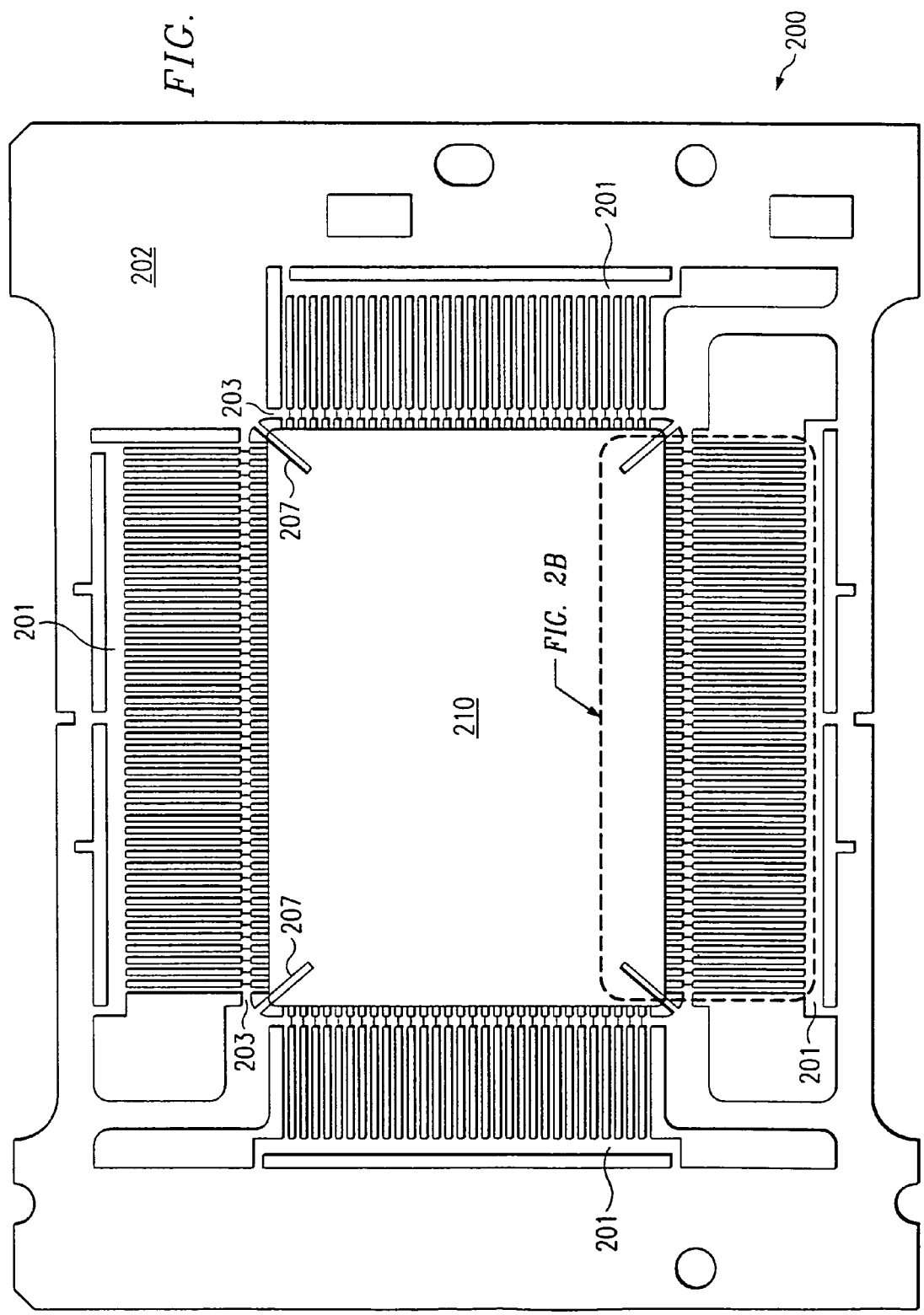

SEMICONDUCTOR LEADFRAME FOR STAGGERED BOARD ATTACH

This application is a divisional of application Ser. No. 09/990,846 filed Nov. 21, 2001 now U.S. Pat. No. 6,707,135, which claims priority under 35 U.S.C. §119(e) of provisional application Ser. No. 60/253,505 filed Nov. 28, 2000.

FIELD OF THE INVENTION

The present invention is related in general to the field of semiconductor devices and processes and more specifically to the design, materials and fabrication of leadframes for high pin-count surface mount integrated circuit devices.

DESCRIPTION OF THE RELATED ART

The leadframe for semiconductor devices was invented (U.S. Pat. Nos. 3,716,764 and 4,034,027) to serve several needs of semiconductor devices and their operation simultaneously: First of all, the leadframe provides a stable support pad for firmly positioning the semiconductor chip, usually an integrated circuit (IC) chip. Since the leadframe including the pads is made of electrically conductive material, the pad may be biased, when needed, to any electrical potential required by the network involving the semiconductor device, especially the ground potential.

Secondly, the leadframe offers a plurality of conductive segments to bring various electrical conductors into close proximity of the chip. The remaining gap between the ("inner") tip of the segments and the conductor pads on the IC surface are typically bridged by thin metallic wires, individually bonded to the IC contact pads and the leadframe segments. Obviously, the technique of wire bonding implies that reliable welds can be formed at the (inner) segment tips.

Thirdly, the ends of the lead segment remote from the IC chip ("outer" tips) need to be electrically and mechanically connected to "other parts" or the "outside world", for instance to assembly printed circuit boards. In the overwhelming majority of electronic applications, this attachment is performed by soldering. Obviously, the technique of soldering implies that reliable wetting and solder contact can be performed at the (outer) segment tips.

Finally, the leadframe not only has to tolerate an encapsulation process at elevated temperatures, but also should be amenable to good adhesion to the encapsulating material wherever the leadframe and the encapsulating material share a common boundary. The adhesion should withstand thermomechanical stresses and prevent the ingress of unwanted moisture and chemicals.

It has been common practice to manufacture single piece leadframes from thin (about 120 to 250 $\mu$m) sheets of metal. For reasons of easy manufacturing, the commonly selected starting metals are copper, copper alloys, iron-nickel alloys for instance the so-called "Alloy 42"), and invar. The desired shape of the leadframe is etched or stamped from the original sheet. In this manner, an individual segment of the leadframe takes the form of a thin metallic strip with its particular geometric shape determined by the design. For most purposes, the length of a typical segment is considerably longer than its width.

The trend in semiconductor technology is towards ever more input/output terminals for signal and power connections. This high pin-count trend has introduced the board attach method called "surface mount technology", which gradually supplanted the previously dominant trough-hole assembly. In the surface mount technology, the outer lead tips are either bent in "J form" or, more popular, as "gull wings".

In support of high pin counts, the trend is further driving towards ever finer lead pitches. While the leadframe fabrication methods of both stamping and etching allow the manufacture of fine lead pitches, the success of surface mounting remains, in known technology, primarily limited by the capability of the soldering-process in board attachment. Lead pitches of 0.3 mm have been manufactured for the outer segment tips (with analogous inner segment tip pitches), and pitches of 0.15 mm have been proposed (for comparison, the diameter of a human hair falls in the range of 0.1 to 0.3 mm), but the solder attachment remains problematic.

While the wire bonding issues related to the fire-pitch inner segment tips has been aggressively addressed, only little work has been performed to solve the problems of fine-pitch outer segment tips. Molded packages having castellated periphery and lead arrangement allow a staggered positioning—and thus substantial physical separation—of the lead attachment pads on a wiring substrate or circuit board. The risk of electrical shorts by merging of the liquid solder is thus mitigated, but the cost of the precision-mechanical molds for fabricating fine-pitch packages is still prohibitive.

An urgent need has therefore arisen for a low-cost, reliable design approach for high lead count, fine-pitch IC leadframes which provides all the assembly features leadframes are expected to offer: Simple design, ease of chip assembly, bondability and solderability. The new leadframe and its method of fabrication should be flexible enough to be applied for different semiconductor product families and a wide spectrum of design and assembly variations, and should achieve improvements toward the goals of improved process yields and device reliability.

SUMMARY OF THE INVENTION

The semiconductor integrated circuit (IC) device according to the present invention comprises a planar leadframe having lead segments arranged in alternating order into first and second pluralities, the segments having their inner tips near the chip mount pad and their outer tips remote from the mount pad. The outer tips have a solderable surface. All outer tips are bent away from the leadframe plane into the direction towards the intended attachment locations on an outside substrate such that the first segment plurality forms an angle of about 70±1° from the plane and the second segment plurality forms an angle of about 75±1°. Consequently, the outer tips create a staggered lead pattern suitable for solder attachment to an outside substrate.

The present invention is related to high density ICs, especially those having high numbers of inputs/outputs, and also to low end, low cost devices. These ICs can be found in many semiconductor device families such as standard linear and logic products, digital signal processors, microprocessors, digital and analog devices, high frequency and high power devices, and both large and small area chip categories. The package type can be small outline ICs (SOICs), quad flat packs (QFPs), thin QFPs (TQFPs), SSOPs, TSSOPs, TVSOPs, and other leadframe-based packages.

It is an aspect of the present invention to provide a leadframe with a dambar so that each dambar portion between the leadframe segments has a cut penetrating partially into the leadframe metal such that it is operable to open fully under the forces of the trim/form process.

Another aspect of the present invention is to provide the assembly of the IC device onto an outside wiring substrate or circuit board, wherein the substrate has rows of solderable attachment pads configured in a staggered pattern mirror-imaging the pattern of the leadframe segments of the device.

Another aspect of the invent-on is to provide a method of trimming and forming the leadframe strip made of a planar metal sheet. First, the length of the first plurality of the outer segments is trimmed, and then bent at an angle of about 70±1° against the leadframe plane. Second, the length of the second plurality of the outer segments is trimmed to a length different (usually shorter) compared to the length of the first segment plurality, and then bent at an angle of about 75±1° against the leadframe plane.

Another aspect of the invention is to bend the outer segment tips into a co-planar shape suitable for reliable attachment (usually by soldering) onto an outside wiring substrate.

Another aspect of the invention is to avoid the trimming of the dambar and rather replace this operation by the rupturing of the dambar portions, enabled by the prefabricated partial cuts in these portions. Proper bending of the two segment pluralities clearly separates the dambar portions in order to avoid electrical shorts.

These aspects have been achieved by the teachings of the invention concerning the geometries of the first and second pluralities of leadframe segments, the structure and rupturing method of the dambar, and the bending process and difference of the first and second leadframe pluralities.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 1 is a top view drawing of the leadframe for the 14 mm×20 mm, 80-lead Quad Flat Pack device, as used in known technology.

FIG. 2 is a simplified top view of the leadframe for the 14 mm×20 mm Quad Flat Pack device, as modified according to the present invention for a 160-lead device.

FIG. 2A is a top view of the leadframe for the 14 mm×20 mm Quad Flat Pack device, as modified according to the present invention for a 160-lead device, after encapsulating the device.

FIG. 3 illustrates the process steps for trimming and forming the leadframe according to the invention.

DETAILED DESCRIPTION OF THE PREFERRED EMBODIMENTS

Figure 2B:
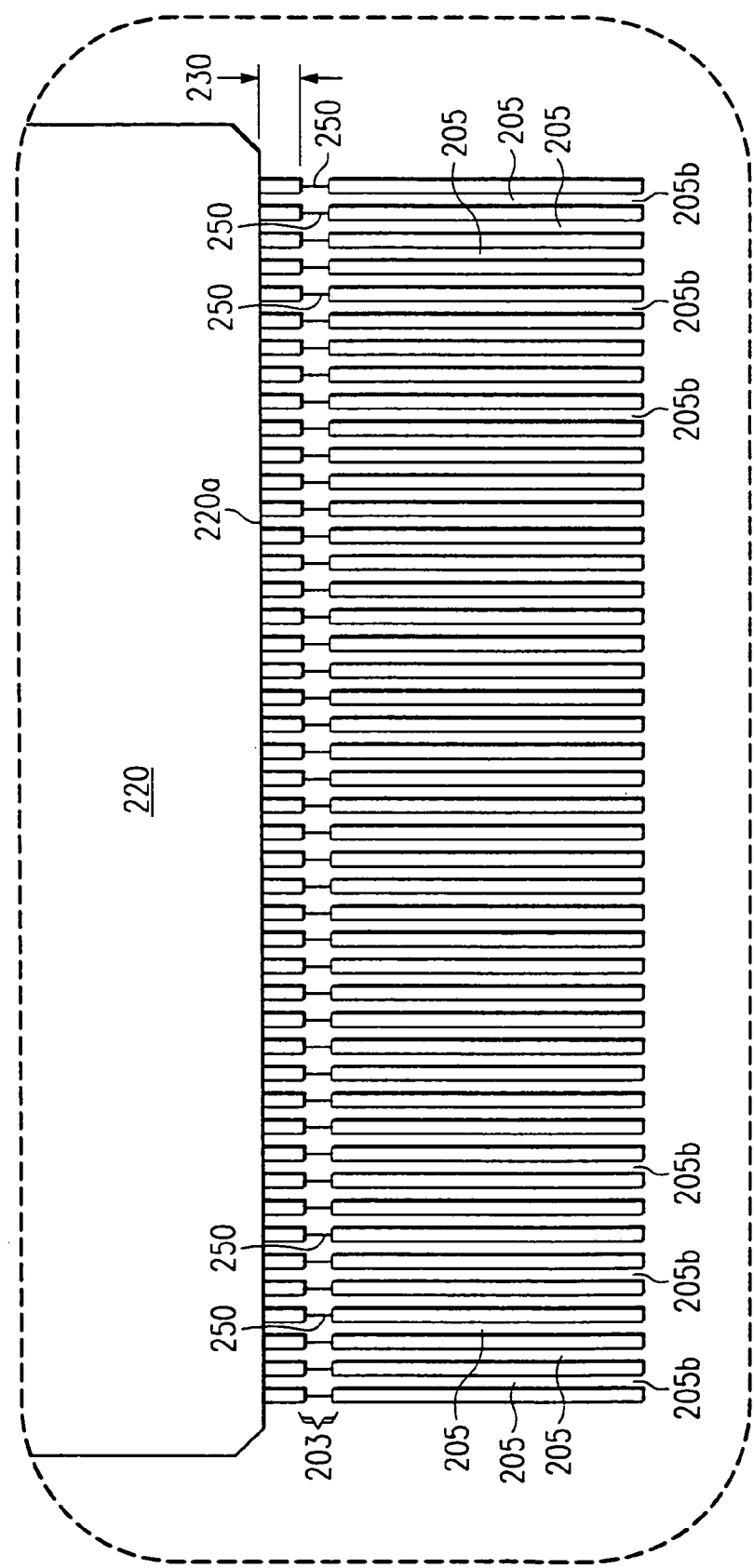
FIG. 2B is a schematic enlarged top view of a portion of the leadframe for the 14 mm×20 mm Quad Flat Pack device, according to the invention.

The impact of the present invention can be most easily appreciated by highlighting the shortcomings of the known technology. By way of example, FIG. 1 shows the simplified top view of the existing 14 mm×20 mm Quad Flat Pack package for integrated circuit (IC) chips. The package is designed for use in surface mount assembly by so called "gull-wing"-shaped leads.

FIG. 1 depicts a single leadframe unit, generally designated 100, stamped or etched from a thin, flat sheet of metal. The leadframe unit includes carrier rails 101, outer leadframe 102 and dam bar 103; they are needed for the device assembly, but discarded after the singulation step. Further indicated in FIG. 1 is the periphery 104 of the molded encapsulation.

The leadframe unit 100 further includes the plurality of pad segments 105 (sometimes referred to as "pins"). As defined herein, each lead segment 105 has a first end ("inner lead tip") 105a near the chip mount pad 106, and a second end ("outer lead tip") 105b remote from chip mount pad 106. In the example of FIG. 1, the leadframe unit has 80 lead segments 105, since it is designed for a plastic 80-lead Quad Flat Pack chip carrier.

Further, the leadframe unit 100 includes a plurality of support members 107, which extend from carrier rail 101 toward chip mount pad 106. In the example of FIG. 1, the device has 4 support members 107.

Lead segments 105 may be stamped or etched from a sheet of leadframe material which is sufficiently ductile to allow the bending of outer tips 105b at the end of the device manufacturing process. Suitable sheet-like starting materials typically have a thickness in the range from about 100 to 300 μm. Suitable materials include copper, copper alloy, brass, aluminum, iron-nickel alloy and invar. Lead segments and external leads may also be plated, selectively or by flood plating techniques, with highly conductive metals, such as silver, copper, gold, nickel, or palladium.

The key challenge mastered by the present invention is the task to increase dramatically the lead count, for example by a factor of 2, without increasing the linear dimensions of the leadframe unit. In particular, the periphery 104 of the molded encapsulation is required to stay constant, so that the footprint ("outline") of the device on the outside part (for instance, circuit board or wiring substrate) can stay the unchanged. This challenge involves a reduction of the lead pitch by a factor of 2. A series of innovations, as described in the present invention, are needed to master this challenge.

FIGS. 2A and 2B illustrate the detail of the leadframe innovations according to the present invention in order to accomplish an increased lead count. In FIG. 2A, the leadframe unit generally designated 200 has the same overall dimensions as the unit 100 in FIG. 1, except the number of leads has doubled to 160. (For simplicity, the leadframe portions 210 enclosed by the molding compound are not shown in FIGS. 2A and 2B). FIG. 2B illustrates the detail of the leadframe segments outside the molded encapsulation.

In FIG. 2A, the leadframe portions corresponding to FIG. 1 are the carrier rails 201, the outer leadframe 202, and the support members 207 (only their onsets at the leadframe are shown in FIG. 2A). A pivotal difference, however, to the conventional leadframe in FIG. 1 with its dambar 103 are the design and functional attributes of the dambar 203 of the present invention (FIGS. 2A and 2B). In order to describe this difference, the lead frame segments positioned along one device side are shown enlarged, but somewhat schematic, in FIG. 2B.

The purpose of dambar 203 in FIG. 2B is still to prevent the molding compound 220 from flashing outward between the segments during the transfer molding process. In the polymerization ("curing") step of the epoxy-based molding compound, the compound undergoes a volumetric shrinking process; consequently, it withdraws a short distance 230 from the dambar. After this withdrawal, the metallic continuity of the dambar needs to be opened up, and the segments separated from any direct connection in order to prevent electrical shorts between the segments. In conventional technology, this separation is accomplished by mechanically cutting out ("trimming") all the dambar portions between the segments. The trimming process is executed by precision-mechanical cutting tools in commercially available trim/form machines.

For the fine lead pitch of the high pin-count devices of this invention, the option of mechanical trimming presents too much risk of damaging the segments, and is prohibitive in terms of precision machine cost. The solution provided of this invention includes the following features (see FIG. 2B):

The plurality of leadframe segments 205 are formed from a single sheet of metal; the segments lie in the plane of the metal sheet. The segments 205 have elongated shape; the elongation is oriented approximately perpendicular to the adjacent periphery 220a of the molded package;

the dambar 203 is integral with the metal segments 205 such that a portion of the dambar interconnects each segment with one or more of its adjacent neighbor segments. The dambar 203 is in proximity to the molded package 220 (distance 230) and approximately parallel to the package periphery 220a;

each of these dambar portions has a cut 250 (produced by the leadframe manufacturer), in the direction of the segment elongation. The cuts penetrate partially into the metal sheet to an extent that the cuts will open fully under the forces applied in the forming process steps (see below). After the forming operation, each segment will have a protrusion attached on each side, consisting of a piece of the dambar attached. Consequently, care has to be taken in the segment forming process to avoid an electrical short between the segments by any touching metal parts;

the leadframe segments 205 are made of a material capable of bending in the segment forming process into directions and at angles different from the metal sheet plane.

Suitable metal sheets have a thickness from about 50 to 300 μm, and the material is selected from the group consisting of copper, copper alloy, brass, aluminum, iron-nickel alloy, and invar. The outer tips 205b of the segments may have a solderable surface. A suitable solderable surface is selected from the group consisting of palladium over nickel, gold, silver, tin, or tin alloys.

The process steps of trimming and forming the leadframe segments are described in FIG. 3. In the sequence from FIG. 3A to FIG. 3J, schematic cross sections of a molded package portion are shown, with protruding outer segments, to illustrate the step-by-step formation of the staggered lead pattern of the present invention.

A leadframe strip made of a planar metal sheet (thickness 350) has thereon a plurality (2 to 10, or more) of molded, or otherwise encapsulated, IC devices (molded package 360).

Figure 3A:
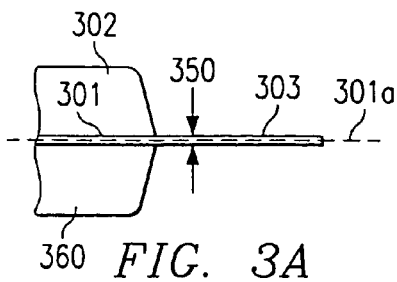
FIGS. 3A through 3J are schematic cross sections of portions of a molded device with outer leadframe segments protruding from the molded package, depicted at sequential process steps (from FIG. 3A to FIG. 3J) for segment trimming and forming.
Figure 3B:
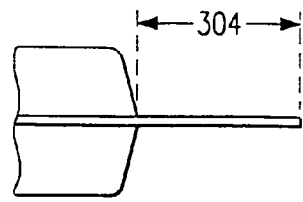
Figure 3C:
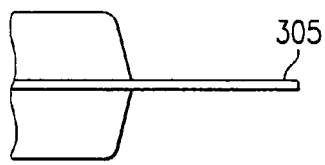
Figure 3D:
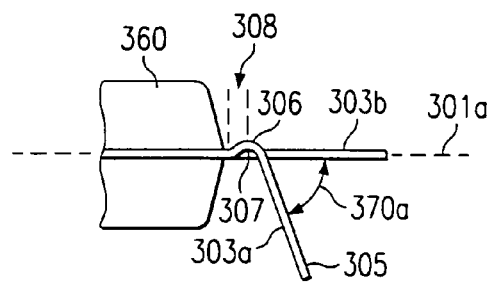
Figure 3E:
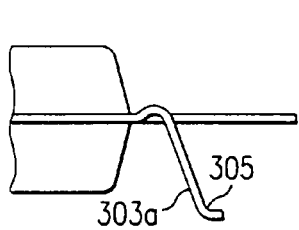
Figure 3F:
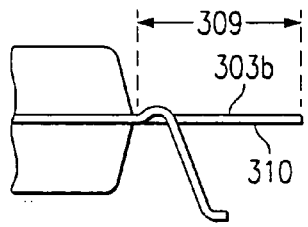
Figure 3G:
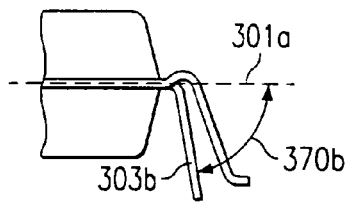
Figure 3H:
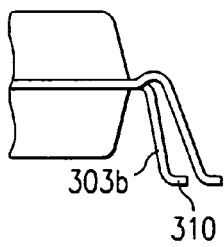
Figure 3I:
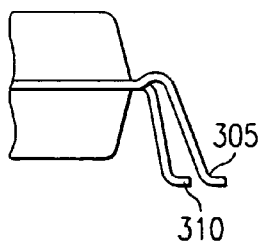
Figure 3J:
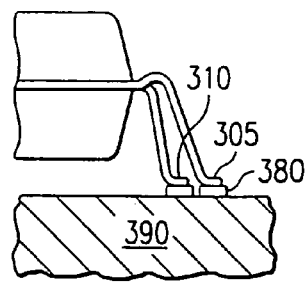

The strip is submitted to a trim/form machine for trimming, forming and singulating the devices. In cross section, one of these devices has a portion as depicted in FIG. 3A, with the planar leadframe sheet 301, molded package 302, and protruding leadframe segments 303. The planar leadframe sheet 301 determines the plane 301a. The outer segments include the dambar and the outer rails; the dambar portions have partial cuts as described in FIG. 2B. The whole leadframe strip is being loaded into the machine, and the process steps are as follows:

Grouping the outer leadframe segments into first and second pluralities (303a and 303b);

trimming the length of the first plurality 303a of cuter segments (see FIG. 3B) to a predetermined value 304. This cut is detaching these segments 303a from the outer leadframe rails and creating the outer segment tips 305 of the first plurality;

bending the first plurality 303a of outer segments at a first angle away from the plane 301a by executing the following process steps, as illustrated in FIG. 3D:

bending the segments of the first plurality in a loop 306. This loop may form an approximate half-circle, or "U-turn", having a center 307 positioned approximately in the leadframe plane 301a about one to two sheet thicknesses removed from the device encapsulation 360, and a radius 308 about equal to the sheet thickness. It is crucially important for the present invention that this process step ruptures the dambars along the pre-fabricated cuts;

bending the segments of the first plurality 303a away from plane 301a into the direction towards he intended attachment locations on an outside part. After this bending, the segments 303a form an angle 370a of about 70±1° from the plane 301a; and bending the (solderable) segment tips 305 into a shape suitable for attachment onto on outside part; see FIG. 3E.

trimming the length of said second plurality 303b of outer segments (see FIG. 3F) to a predetermined value 309. This cut is detaching these segments 303b from the outer leadframe rails and creating outer segment tips 310 of the second plurality 303b. It is important that these segment tips 310 have different length 309 compared to the length 304 of the segment tips 305 of the first plurality 303a (length 309 is usually shorter than length 304);

bending the second plurality 303b of outer segments at a second angle away from said plane 301a by executing the following process steps, as illustrated in FIG. 3G:

bending the segments of the second plurality away from plane 301a into the direction towards the intended attachment locations on an outside part. After this bending, the segments 303b form an angle 370b of about 75±1° from the plane 301a; and bending the (solderable) segment tips 310 into a shape suitable for attachment onto an outside part, see FIG. 3H.

selecting the first and second angles 370a and 370b such that the outer segments 303a and 303b form a staggered pattern of segment tips 305 and 310, respectively, suitable for attachment onto staggered pads 380 of an outside part 390; see FIG. 3J. The pattern of tips 305 and 310 mirror-images the pattern of the staggered pads 380 pre-fabricated on the outside part 390;

planarizing tips 305 and 310 (see FIG. 3I) to insure co-planarity for reliable attachment; and singulating the IC devices by fully trimming and discarding the outer leadframe rails.

Figure 4:
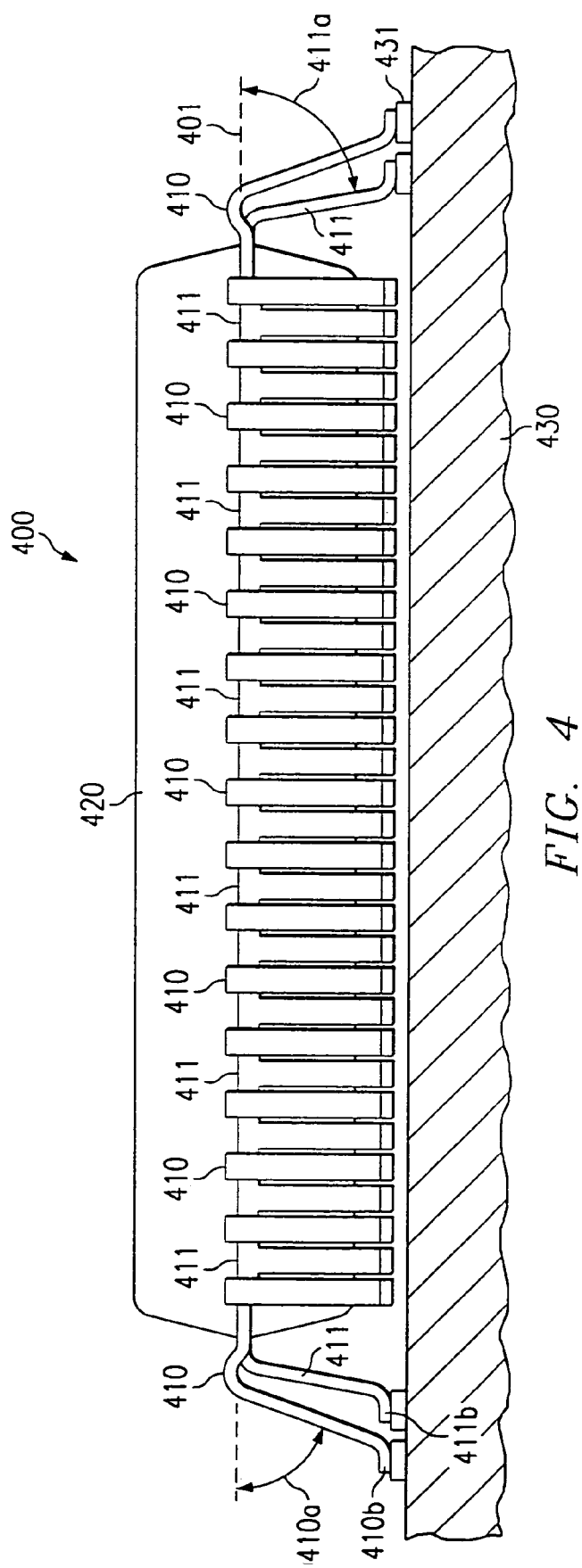
FIG. 4 is a side view of the finished Quad Flat Pack device after trimming and forming the package leads according to the invention.

FIG. 4 is the finished Quad Flat Pack device, generally designated 400, depicted in side view, after completion of the trimming and forming steps according to the innovations of the present invention. Looking at the device parts visible in FIG. 4 from the outside of the device, the most noticeable feature according to the present innovation are the leadframe segments arranged in alternating order into first plurality 410 and second plurality 411. Only the outer tips of these leadframe segments are depicted in FIG. 4; they exit the molded package 420 substantially in one plane 401. All these outer tips are bent away from plane 401 into the direction towards the intended attachment locations 431 or an outside part 430. The bending is such that the first segment plurality 410 forms an angle 410a (of about 70±1°) from plane 401 and the second segment plurality 411 forms an angle 411a (of about 75±1°) from plane 401.

As a result of these different bending angles, the outer tips 410b and 411b create a staggered lead pattern suitable for solder attachment to outside part 430. Outer tips 410b and 411b have a solderable surface. The staggered segment pattern thus created allows a fine pitch and a high number of segments. In the Quad Flat Pack example of FIG. 4 (total dimensions 14 mm×20 mm), the conventional segment number 80 can be increased to 160 according to the invention.

Inside the molded package 420 are (not shown in FIG. 4) an IC chip, having an active and a passive surface. The passive chip surface is attached to the mount pad of the leadframe. The perimeter of the chip mount pad is held to the leadframe rails by a plurality of support members. The chip mount pad is surrounded by, but spatially separated from, the plurality of inner tips of the leadframe segments. The active chip surface is interconnected to the inner segment tips by conductors, such as bonding wires or ribbons, which bridge the spatial separation.

The chip mount pad, support members, inner segment tips, all located inside the molded package 420, are positioned substantially in the plane 401. The encapsulation material 420 surrounds the IC chip, the conductors, and the inner segment tips, while it leaves the outer segment tips 410b and 411b exposed so that these outer segment tips are suitable for solder attachment to an outside part 430. The encapsulation material preferably is a polymerizable polymeric material selected from the group consisting of epoxy-based molding compounds, filled with inorganic fillers and suitable for adhesion to the active chip surface, bonding wires, and inner leadframe segment tips.

The solder attachment of segment tips 410b and 411b to attachment pads 431 of the outside part (typically a wiring substrate or circuit board) preferably uses solder materials selected from the group consisting of pure tin, tin alloys such as tin/indium, tin/silver, tin/bismuth, and tin/lead, and conductive adhesive compounds.

The assembly of the IC device 400 having first and second pluralities of leadframe segments (410 and 411, respectively, in FIG. 4) and an outside part such as a wiring substrate or circuit board (430 in FIG. 4), comprises:

The outside part having rows of solderable attachment pads 431 configured in a staggered pattern mirror-imaging the pattern of the leadframe segments 410b 411b of the IC device;

the IC device having leadframe segments 410 and 411 suitable for solder attachment and configured in a staggered pattern, which is created by different bending angles of the leadframe segments if the first and second pluralities; and the IC device 400 being solder-attached to the outside part 430, whereby an assembly on staggered attachment locations is created. The staggered pad arrangement prevents a shorting of the solder in the reflow attachment during assembly.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, the arrangement of the leadframe segments can be modified to be suitable for device families of elongated contours, or rectangular, or square perimeter. Outside segment pitches of 0.3 mm or even smaller can be manufactured. It is therefore intended that the appended claims encompass any such modifications or embodiments.

I claim:

1. A leadframe structure for use in a staggered attachment of integrated circuit devices having a periphery, comprising:
   a plurality of leadframe segments formed from a single sheet of metal, said segments lying in the plane of said metal sheet;
   a dambar integral with said metal segments such that a portion of said dambar interconnects each of said segments with one or more of its adjacent neighbor segments;
   each of said dambar portions having a cut penetrating partially into said sheet metal such that it is operable to open fully under the forces of a forming process; and
   said leadframe segments capable of bending in a forming process, into directions and angles different from said plane.

2. The leadframe according to claim 1 wherein said dambar is positioned in proximity and approximately parallel to said device periphery.

3. The leadframe according to claim 1 wherein said segments are elongated, said elongation oriented approximately perpendicular to said adjacent device periphery.

4. The leadframe according to claim 3 wherein said dambar cut is in the direction of said segment elongation.

5. The leadframe according to claim 1 wherein said metal sheet has a thickness from about 50 to 300 $\mu$m.

6. The leadframe according to claim 1 wherein said metal sheet is selected from the group consisting of copper, copper alloy, brass, aluminum, iron-nickel alloy, and invar.

7. The leadframe according to claim 1 wherein at least a portion of said segments has a solderable surface.

8. The leadframe according to claim 7 wherein said solderable surface is selected from the group consisting of palladium over nickel, gold, silver, tin, or tin alloys.

* * * * *